United States Patent [19]

Gaku et al.

[11] Patent Number: 5,160,787
[45] Date of Patent: Nov. 3, 1992

[54] ELECTRICAL LAMINATE HAVING ABILITY TO ABSORB ULTRAVIOLET RAYS

[75] Inventors: Morio Gaku; Kenzi Ishii; Takamasa Nakai, all of Tokyo, Japan

[73] Assignee: Mitsubishi Gas Chemical Company, Inc., Tokyo, Japan

[21] Appl. No.: 754,997

[22] Filed: Sep. 5, 1991

Related U.S. Application Data

[63] Continuation-in-part of Ser. No. 463,199, Jan. 10, 1990, abandoned.

[30] Foreign Application Priority Data

Jan. 12, 1989 [JP] Japan .................................... 1-3647
Jan. 27, 1989 [JP] Japan .................................... 1-16401
Feb. 28, 1989 [JP] Japan .................................... 1-45434

[51] Int. Cl.$^5$ ............................................ B32B 15/08
[52] U.S. Cl. ............................ 428/333; 428/417; 428/418; 428/460; 428/241; 428/285; 428/901
[58] Field of Search ............... 428/418, 417, 333, 460, 428/901

[56] References Cited

FOREIGN PATENT DOCUMENTS 02-227442 9/1990 Japan .

Primary Examiner—P. C. Sluby
Attorney, Agent, or Firm—Browdy and Neimark

[57] ABSTRACT

An electrical laminate having an ability to absorb or shield ultraviolet rays having wavelength of 300–420 nm which comprises (i) at least one thermosetting resin-impregnated substrate, (ii) said substrate and a metal foil or (iii) said substrate, a metal foil and an adhesive layer for the metal foil comprising a thermosetting resin, characterized in that the thermosetting resin constituting part or all of said substrates or constituting said adhesive layer contains 0.2–6.0% by weight of a light absorber (A) on the basis of weight of the thermosetting resin, said light absorber is (a) an alkylthioxantone or a mixture of (a) said alkylthioxantone and (b) an ultraviolet rays-absorber.

6 Claims, No Drawings

ELECTRICAL LAMINATE HAVING ABILITY TO ABSORB ULTRAVIOLET RAYS

This is a continuation-in-part application of U.S. Ser. No. 07/463,199, filed on Jan. 10, 1990, now abandoned without prejudice in favor of the present application.

FIELD OF THE INVENTION

This invention relates to an electrical laminate having ability to absorb ultraviolet rays.

BACKGROUND OF THE INVENTION

Generally speaking, the electrical laminate is prepared by the following methods:
Printed wirings are formed on a laminate;
(i) a method comprising a step of forming printed wirings on a substrate, a step of forming ultraviolet rays-sensitive resin layers on the both sides of the substrate and a step or irradiating ultraviolet rays to the sensitive resin layers from the both sides to form a desired pattern, or
(ii) a method comprising a step of forming ultraviolet rays-sensitive resin layers on the both sides of a substrate, a step of forming a desired pattern by means of ultraviolet rays and a step of forming electroless plating layers on the pattern to form printed wirings.

In these methods, ultraviolet rays are necessarily irradiated onto the sensitive resin layers from the both sides at the same time. In this case, there is a possibility that the ultraviolet rays pass through the laminate and sensitize the sensitive layer of the opposite side. This inhibits the forming of a precise pattern.

In the prior art, laminates or metal foil-clad laminates have been prepared by laminate-molding prepregs obtained by impregnating glass non-woven fabrics or glass woven fabrics with epoxy resin and drying them, or by stacking the prepreg and a metal foil and then laminate-molding them, respectively. In such prior art, in order to prevent passing of ultraviolet rays through the laminate, an inorganic filler or a dyestuff has been incorporated into the resin component in the laminate. After the resin containing an inorganic filler or a dyestuff was cured, that the inorganic filler or the dyestuff sometimes discolored the cured resin. Japanese Patent Public Disclosure (Kokai) No. 132390/1987 etc. disclose that an ultraviolet rays-absorber and/or a fluorescent brightener is incorporated into the resin in the laminate. However, the ultraviolet rays-absorber does not completely absorb the light having 300-420 nm under which a conventional resist is sensitized, and discolors the resin. The fluorescent brightener generates fluorescence.

SUMMARY OF THE INVENTION

The inventors have intensively studied methods by which the above-mentioned problems are solved. As a result, we found a method by which the resin is modified by an additive so as to have an ability to sufficiently absorb ultraviolet rays without the aforementioned deficiencies and by which the electrical laminate can be easily produced. The present laminate prevents the above-mentioned shortcomings of having ultra-violet rays pass through the laminate to sensitize the sensitive layer of the opposite side and thus inhibit the forming of a precise pattern. Preferred laminates of the present invention are heat-resistant and are not discolored. The above invention is based on this discovery.

This invention relates to an electrical laminate having an ability to absorb or shield ultraviolet rays having wavelength of 300-420 nm which comprises (i) at least one thermosetting resin-impregnated substrate, (ii) said substrate and metal foil or (iii) said substrate, a metal foil and an adhesive layer for the metal foil comprising a thermosetting resin, characterized in that said thermosetting resin constituting part or all of said substrate or constituting said adhesive layer contains 0.2-6.0% by weight of a light absorber (A) on the basis of weight of the thermosetting resin, said light absorber being selected from the group consisting of (a) alkylthioxantone and a mixture of (a) said alkylthioxantone and (b) an ultraviolet rays absorber, said alkylthioxantone being represented by the formula

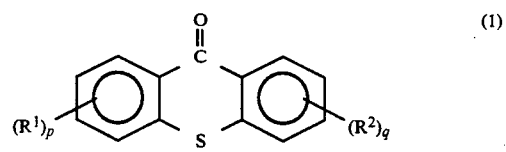

wherein each of $R^1$ and $R^2$ independently represents alkyl group, each of p and q independently represents 0 or an integer of not more than 4, and $p+q \geq 1$.

Preferably, the alkylthioxantone is 2,4-dimethylthioxantone, 2,4-diethylthioxantone, 2,4-diisopropylthioxantone or 4-isopropylthioxantone.

Examples of ultraviolet rays-absorbers include 2-(2-hydroxy-5-methylphenyl)benzotriazole, 2-(2-hydroxy-5-butylphenyl)benzotriazole, 2-(2-hydroxy-3,5-di-t-butylphenyl)benzotriazole, 2-(2-hydroxy-3,5-di-t-amylphenyl)benzotriazole and 2-(2-hydroxy-3-t-butyl-5-methylphenyl)-5-chlorobenzotriazole.

Preferably, the light absorber in an amount of 2-6% by weight is contained in only the thermosetting resin constituting the adhesive layer, or the light absorber in an amount of 2-6% by weight may be contained only the thermosetting resin in one of the substrates.

DETAILED DESCRIPTION OF THE INVENTION

The thermosetting resin-impregnated substrates employed in the present invention are not specifically limited, as long as it is known that they are used as electrical laminates. The substrates may be almost transparent, such as glass non-woven fabrics, glass woven fabrics, mixed non-woven fabrics of glass fibers and the other fibers or mixed woven fabrics of glass fibers and the other fibers.

The thickness of the substrate is not specifically limited but is preferably between 0.1 and 0.40 mm. The thermosetting resins employed in the present invention are not specifically limited, as long as it is known that they are used in the electrical laminates.

Examples of the thermosetting resins include epoxy resins such as bisphenol A type epoxy resin, phenolnovolak type epoxy resin, cresolnovolak type epoxy resin, brominated bisphenol A type epoxy resin, brominated phenolnovolak type epoxy resin, and other polyfunctional epoxy resins. To the epoxy resin may be added heat-resistant engineering plastics such as a polyetherimide or a polyphenylene ether; known resins for modification such as saturated or unsaturated polyester resins; known curing agents such as dicyandiamides, phenols such as diaminodiphenylmethane or phenolnovolak resin, acid anhydrides; curing catalysts such as imidazoles such as 2-methylimidazole, 2-ethyl-4-methylimidazole, 2-undecylimidazole, 2-heptadecylimidazole, 2-phenylimidazole or 1-benzyl-2-methylimidazole, and amines such as benzyldimethylamine; inorganic fillers; organic fillers; flame-retardants; pigments; dyes; etc. The thermosetting resin compositions which constitute adhesives or an adhesive layers are exemplified by the ones as mentioned above or ones to which polyvinylbutyral resin and/or melamine resin is added.

The light absorber (A) of the present invention is used by adding it to the thermosetting resin constituting part or all of the substrates and/or the thermosetting resin constituting the adhesive layer. Light absorber (A) is selected from the group consisting of the alkylthioxantone (a) and a mixture of the alkylthioxantone (a) and the ultraviolet rays-absorber (b).

Examples of the alkylthioxantones include 2,4-diethylthioxantone, 2,4-diisopropylthioxantone, 2,4-dimethylthioxantone and 4-isopropylthioxantone.

Examples of ultraviolet rays-absorbers include 2-(2-hydroxy-5-methylphenyl)benzotriazole, 2-(2-hydroxy-5-butylphenyl)benzotriazole, 2-(2-hydroxy-3,5-di-t-butylphenyl)benzotriazole, 2-(2-hydroxy-3,5-di-t-amylphenyl)benzotriazole and 2-(2-hydroxy-3-t-butyl-5-methylphenyl)-5-chlorobenzotriazole; oxalic acid anilide type ultraviolet rays-absorbers such as 2-ethoxy-2'-ethyloxalic acid bisanilide and 2-ethoxy-5-t-butyl-2'-ethyloxalic acid bisanilide; and an ultraviolet rays-absorber such as 2,4-dihydroxybenzophenone, 2-hydroxy-4-methoxybenzophenone, 2-hydroxy-4-n-octoxybenzophenone, 2-hydroxy-4-n-dodecyloxybenzophenone, 2,2',4,4'-tetrahydroxybenzophenone, 2,2'-dihydroxy-4,4'-dimethoxybenzophenone, 2-hydroxy-4-benzyloxybenzophenone, 2-cyano-3,3-diphenylethyl acrylate, and so on.

The amount of the light absorber (A) used is in the range from 0.2 to 6% by weight of total solid matter of thermosetting resin. The methods for allowing the light-absorber (A) to be incorporated into the laminate are as follows:

(i) The thermosetting resin containing the light absorber (A) is used in all of prepregs;

(ii) The thermosetting resin containing the light absorber (A) is used in the prepregs which are in the center or at the both sides of the laminate, and (iii) The thermosetting resin containing the light absorber (A) is used in the adhesive layer for the metal foil.

When the laminate is thin, the light-absorber is mixed into only a part of the prepreg, or it is mixed only into the thermosetting resin contained in the adhesive layer for the metal foil. The absorber is used in a relatively large amount of 1 to 6% by weight, particularly 2 to 6% by weight. When the laminate is thick and the absorber is mixed into the entire resin, it is mixed in a relatively small amount of 0.2 to 2% by weight. When the amount of the absorber employed is less than 0.2% by weight, the ultraviolet rays-absorbing ability which the resulting laminate has is poor, and the absorber in an amount of more than 6.0% by weight is excessive and unnecessary. In the case components (a) and (b) are used together, it is preferable to use component (a) in an amount of at least 0.1% by weight.

When the light-absorber is incorporated only into the adhesive layer for metal foil, the light absorber-containing adhesive layer 10-100 μm thick is formed on the back surface of metal foil, or the adhesive layer 10-100 μm thick is formed on the surface of prepreg to be adhered to a metal foil, followed by forming the laminate from the metal foil or the prepreg with the adhesive layer.

The metal foils employed in the present invention include, for example, copper foil, aluminum foil, iron foil and the like.

These materials may be laminate-molded by means of an usual laminated molding method such as multi-daylight press, multi-daylight vacuum press, continuous molding, autoclave molding, etc. under the usual laminated molding conditions, for example, at a temperature of 100° to 200° C. and a pressure of 2 to 100 kg/cm² and for a period of 0.03 to 3 hours.

This invention is further illustrated by the non-limiting examples. Part and percent are on a weight basis, unless otherwise specified.

EXAMPLE 1 AND CONTROL RUN 1

100 parts of brominated bisphenol A type epoxy resin (Trade name: Epikote 1045; Br content: 18–20%; Epoxy equivalent: 450–500; manufactured by Yuka-Shell Epoxy Co.), 3.5 parts of dicyandiamide, and 0.2 parts of 2-methylimidazole were dissolved in a mixed solvent of methyl ethyl ketone and N,N-dimethylformamide to obtain an epoxy resin varnish (hereinafter referred to as "Varnish 1"). The Varnish 1 was impregnated into a plain weave glass woven fabric having a thickness of 0.18 mm, and the fabric was dried at 160° C. for 6 minutes to produce a prepreg having a resin content of 45% (hereinafter referred to as "PPN").

Prepreg having a resin content of 45% and slightly colored yellow (hereinafter referred to as "PP1") was produced in the same manner as mentioned above, except that 2,4-diethylthioxantone was additionally blended with Varnish 1 in an amount of 2.0% on the basis of the solid of the resin.

PPN and PP1 obtained above were stacked as mentioned in Table 1, and sandwiched between electrolyzed copper foils 35 μm thick, and the laminate was then laminate-molded at 170° C. and 30 kg/cm² for 2 hours to produce a double sided copper-clad laminate 1.6 mm thick.

The copper-clad laminate so obtained was etched to remove copper foils of the both sides. A transmission of the laminate was measured, after the laminate was placed at a distance of 20 cm from a high-pressure mercury lamp (wavelength: 300–400 nm; 1 kW, manufactured by Usio-Utec Co.; type HI), and irradiated by 300 mJ/cm², or after the laminate was irradiated by means of a metal halide lamp (wavelength: 380–420 nm; 1 kW, manufactured by Usio-Utec Co.; type GL) of the light intensity of 24 mW/cm² with light in a total amount of 700 mJ/cm². In this connection, light intensity on the surface of the laminate is 10 mW/cm². As a light receptor, UVD-405PD, which is manufactured by Usio-Utec and receives light having a wavelength of 330 to 490 nm, is used.

Liquid resist (manufactured by Taiyo Ink Co.; PSR-1000) was applied to the back surfaces of the above laminate from which copper foils had been removed, and dried, and then the laminate was subjected to an exposure test. Further, hue of the resulting laminate was observed, and was found to be slightly colored blue as in the sample of Control Run 1.

These results are shown in Table 1.

EXAMPLES 2 TO 5

Prepregs were prepared in the same manner as in Example 1, except that 2,4-diisopropylthioxantone (referred to as PP2 hereinafter), 2,4-dimethylthioxantone (referred to as PP3 hereinafter), or 4-diisopropylthioxantone (referred to as PP4 hereinafter) was used in an amount of 1.0%, respectively, instead of 2,4-dimethylthioxantone, or combination referred to as PP5 hereinafter) of an ultraviolet rays-absorber of 2-(2-hydroxy-3,5-di-t-amylphenyl)benzotriazole and 2,4-diethylthioxantone were also used in an amount of 0.35% and 0.15%, respectively. The prepregs were slightly colored yellow.

These results are shown in Table 1.

TABLE 1

|  | Control Run 1 | Example 1 | 2 | 3 | 4 | 5 |
|---|---|---|---|---|---|---|
| Used Prepregs (number of pieces) |  |  |  |  |  |  |
| PPN | 8 | 7 | 7 | 7 | 7 | 7 |
| PP1 |  | 1 |  |  |  |  |
| PP2 |  |  | 1 |  |  |  |
| PP3 |  |  |  | 1 |  |  |
| PP4 |  |  |  |  | 1 |  |
| PP5 |  |  |  |  |  | 1 |
| Transmission (%) |  |  |  |  |  |  |
| High pressure mercury lamp | 13 | 2 | 2 | 2 | 2 | 0 |
| Metahalide lamp | 22 | 5 | 5 | 5 | 5 | 2 |
| Exposure on back surface | yes | no | no | no | no | no |
| Hue of laminate |  | slight blue |  |  |  |  |

CONTROL RUNS 2 AND 3

Prepregs having a resin content of 45% were prepared in the same manner as in Example 1 except that ultraviolet rays-absorbers of 2(2-hydroxy-3,5-di-t-amylphenyl)benzotriazole (referred to as PPC1 hereinafter) or a fluorescent brightener (Trade name: UBITEX OB; manufactured by Ciba-Geigy; referred to as PPC2 hereinafter) were mixed into Varnish 1 in an amount of 2.0% on the basis of the solid of the resin.

A double sided copper-clad laminate was produced in the same manner as in Example 1, except that 6 pieces of PPN and 2 pieces of PPC1 or PPC2 were used.

The resulting copper-clad laminate was etched to remove copper foils on the both sides.

A transmission of the laminates was measured as in Example 1 except that irradiation energy was measured up to 1000 mJ/cm$^2$.

The results are shown with the results of Examples 1 and 5 in Table 2.

TABLE 2

| | | Example or Control Run | | | | | | | | | |
|---|---|---|---|---|---|---|---|---|---|---|---|
| | | Control Run 1 | | Control Run 2 | | Control Run 3 | | Example 1 | | Example 5 | |
| | | Used Prepregs (Number of pieces) | | | | | | | | | |
| | | PPN(8) | | PPN(6) + PPC1(2) | | PPN(6) + PPC2(2) | | PPN(6) + PP1(2) | | PPN(6) + PP5(2) | |
| | | A | B | A | B | A | B | A | B | A | B |
| metal halide lamp | 50 | 11 | 22% | 7.5 | 15% | 5.0 | 10% | 5.0 | 10% | 4.0 | 8% |
| | 100 | 22 | 22% | 15 | 15% | 10 | 10% | 10 | 10% | 8.0 | 8% |
| | 200 | 44 | 22% | 30 | 15% | 20 | 10% | 20 | 10% | 12 | 6% |
| (irradiation | 300 | 66 | 22% | 45 | 15% | 30 | 10% | 30 | 10% | 13 | 4.3% |
| energy) | 500 | 110 | 22% | 75 | 15% | 50 | 10% | 35 | 7% | 14 | 2.8% |
| | 700 | 154 | 22% | 105 | 15% | 70 | 10% | 35 | 5% | 14 | 2.0% |
| (mJ/cm$^2$) | 1000 | 220 | 22% | 150 | 15% | 100 | 10% | 35 | 3.5% | 14 | 1.4% |
| Exposure on back surface (700 mJ/cm$^2$) | | yes | | yes | | yes | | no | | no | |
| high pressure | 50 | 6.5 | 13% | 1.0 | 2% | 1.0 | 2% | 1.0 | 2% | 0 | 0% |
| Mercury lamp | 100 | 13 | 13% | 2.0 | 2% | 2.0 | 2% | 2.0 | 2% | 0 | 0% |
| | 200 | 26 | 13% | 4.0 | 2% | 4.0 | 2% | 4.0 | 2% | 0 | 0% |
| (irradiation | 300 | 39 | 13% | 6.0 | 2% | 6.0 | 2% | 6.0 | 2% | 0 | 0% |
| energy) | 500 | 65 | 13% | 10 | 2% | 10 | 2% | 10 | 2% | 0 | 0% |
| | 700 | 91 | 13% | 14 | 2% | 14 | 2% | 14 | 2% | 0 | 0% |
| (mJ/cm$^2$) | 1000 | 130 | 13% | 20 | 2% | 20 | 2% | 20 | 2% | 0 | 0% |
| Exposure on back surface (700 mJ/cm$^2$) | | yes | | no | | no | | no | | no | |

Note: A = amount of light transmited (mJ/cm$^2$).
B = transmission.

It is apparent from Table 2 that when high pressure mercury lamp emitting light having wavelength below 400 nm is used, laminate containing each an alkylthioxantone, an ultraviolet rays-absorber and a fluorescent whitener exhibits a good shielding property, and that when metal halide lamp emitting light having wavelength of 380–420 nm is used, laminate containing each of a ultraviolet rays-absorber and a fluorescent whitener exhibits a poor shielding property. It is understood that laminate containing an alkylthioxantone has high shielding effectiveness and substantially complete shielding property to light having irradiation energy above 500 mJ/cm$^2$.

CONTROL RUNS 4–9

Prepregs produced in the same manner as in Control Run 2 except that 2,2-dimethoxy-2-phenylacetophenone (Trade name: Irgacure 651; manufactured by Ciba-Geigy; referred to as Ir651 hereinafter), 1-hydroxycyclohexylphenylketone (Trade name: Irgacure 184; manufactured by Ciba-Geigy; molecular weight: 204; m.p.: 44°–48° C.; referred to as Ir184 hereinafter), a cationic photopolymerization initiator (onium salt series; Trade name: Irgacure 261; manufactured by Ciba-Geigy; molecular weight: 386; m.p.: 86° C.; referred to as Ir261 hereinafter), nitrofluorene, nitropyrene, or nitroacenaphthene.

Hue of each of the resulting laminates was observed and toxicity thereof was investigated. The results are shown with the results of Control Runs 1–3 and Examples 1 and 5 in Table 3.

TABLE 3

|  | light absorber | toxicity* | hue of laminate |
| --- | --- | --- | --- |
| Con. R. 1 | not containing | o | slight blue |
| Con. R. 2 | 2(2-hydroxy-3,5-di-t-amylphenyl)benzotriazole (= BTA) | o | slight blue |
| Con. R. 3 | UBITEX OB | o | white blue |
| Exp. 1 | 2,4-diethylthioxantone (= 24TX) | o | slight blue |
| Exp. 5 | BTA + 24TX | o | slight blue |
| Con. R. 4 | Ir651 | o | brown |
| Con. R. 5 | Ir184 | o | brown |
| Con. R. 6 | Ir261 | o | brown |
| Con. R. 7 | nitrofluorene | x | light yellow |
| Con. R. 8 | nitropyrene | x | light brown |
| Con. R. 9 | nitroacenaphthene | x | light brown |

*o . . . non-carcinogenesis (TSCA recognition)
x . . . carcinogenesis

It is apparent from Table 3 that an alkylthioxantone is excellent with respect to toxicity and hue, whereas some of other light absorber has poor hue and some thereof are toxic.

EXAMPLE 6 AND CONTROL RUN 10

A varnish was prepared similarly to Example 1 except that 2,4-diethylthioxantone and 2-(2-hydroxy-3,5-di-t-amylphenyl)benzotriazole were further mixed in each amount of 2% (4% in total), into a Varnish 1 obtained by the same manner as in Example 1. The resulting varnish was applied onto the back surface of electrolyzed copper foils of 35 μm thick using a rollcoater (manufactured by Uenoyama Kiko; F1 continuous processor) by a coating thickness of 70 μm, and the coated foils were then dried at 100° C. for 30 minutes to produce copper foils having an adhesive (referred to as CFI hereinafter).

Copper-clad laminate was produced similarly to Example 1 except that 8 pieces of the same PPN as used in Example 1 were piled up, and CFI's were piled up onto the both sides thereof, and the resulting laminate was examined similarly. These results are shown in Table 4.

For the comparison, the above procedure was repeated except that copper foil having an adhesive was produced using Varnish 1. The results are shown in Table 4.

TABLE 4

|  | Example 6 | Control Run 10 |
| --- | --- | --- |
| Used PPN (number of pieces) | 8 | 8 |
| Adhesive-containing CFI | 2 | 0 |
| Copper foil CF | 0 | 2 |
| Transmission (%) |  |  |
| High pressure mercury lamp | 2 | 13 |
| Metahalide lamp | 6 | 22 |
| Exposure on back surface | no | yes |

Since the electrical laminate of the present invention contains an alkylthioxantone or a combination of an alkylthioxantone and an ultraviolet rays-absorber, it has a good absorbing capacity to the light generated by a high pressure mercury lamp or a metahalide lamp. In particular, the present electrical laminate efficiently absorbs the light having wavelength effective for exposing photosensitive resist, and even when the present laminate is exposed to the light being greater than 500 mJ/cm$^2$, the light-absorbing ability of the laminate is not lowered, and adversely is improved.

Further, the discoloration of the laminate of the present invention may be substantially as slight as of the usual laminate.

Consequently, it will be understood that the electrical laminate of the present invention is extremely excellent in practical use.

We claim:

1. An electrical laminate which comprises (i) at least one thermosetting resin-impregnated substrate, (ii) a combination of said substrate and a metal foil, or (iii) a combination of said substrate, a metal foil and an adhesive layer for the metal foil comprising a thermosetting resin, wherein
said thermosetting resin of at least one said substrate or said adhesive layer contains 0.2 to 6.0% by weight of a light absorber (A) on the bases of the weight of the thermosetting resin,
said light absorber (A) is selected from the group consisting of (a) an alkylthioxantone and said alkylthioxantone (a) and (b) an ultraviolet rays-absorber, said alkylthioxantones represented by the following formula (1):

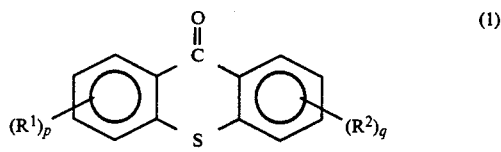

wherein each of $R^1$ and $R^2$ represents alkyl group, each of p and q represents 0 or an integer of not more than 4, and $p+q \geq 1$,
and the electrical laminate having an ability to absorb or shield ultraviolet rays having wavelength of 300–420 nm.

2. The electrical laminate of claim 1 wherein said alkylthioxantone (a) is selected from the group consisting of 2,4-dimethylthioxantone; 2,4-diethylthioxantone; 2,4-diisopropylthioxantone and 4-isopropylthioxantone.

3. The electrical laminate of claim 1, wherein said ultraviolet rays-absorber (b) is selected from the group consisting of 2-(2-hydroxy-5-methylphenyl)benzotriazole, 2-(2-hydroxy-5-butylphenyl)benzotriazole, 2-(2-hydroxy-3,5-di-t-butylphenyl)benzotriazole, 2-(2-hydroxy-3,5-di-t-amylphenyl)benzotriazole and 2-(2-hydroxy-3-t-butyl-5-methylphenyl)-5-chlorobenzotriazole.

4. The electrical laminate of claim 1 wherein said light absorber in an amount of 2–6% by weight is contained in only the thermosetting resin constituting the adhesive layer.

5. The electrical laminate of claim 1 wherein two or more thermosetting resin-impregnated substrates are used, and said light absorber in an amount of 2–6% by weight is contained in only the thermosetting resin in part of the substrates.

6. In an electrical laminate comprising at least one layer formed at least in part of a thermoset resin, the improvement wherein
said layer further comprises 0.2 to 6.0% by weight on the basis of the weight of the thermoset resin of a light absorber, said light absorber being selected from the group consisting of (i) an alkylthioxantone of the formula:

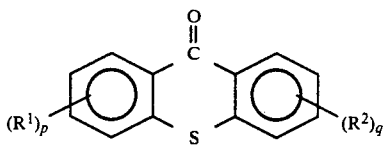

wherein each of $R^1$ and $R^2$ represents alkyl group, each of p and q represents 0 or an integer of not more than 4, and $p+q \geq 1$, and (ii) a mixture of said alkylthioxantone and an ultraviolet ray-absorber, said laminate being capable of absorbing or shielding ultraviolet rays having a wavelength of 300–420 nm.

* * * * *